US011264999B2

(12) United States Patent
Jennings et al.

(10) Patent No.: US 11,264,999 B2
(45) Date of Patent: Mar. 1, 2022

(54) HIGH RESOLUTION COUNTER USING PHASED SHIFTED CLOCK

(71) Applicant: Raytheon Company, Waltham, MA (US)

(72) Inventors: William T. Jennings, Plano, TX (US); Colby Hoffman, Fairview, TX (US); Nick Angelo, McKinney, TX (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 16/816,851

(22) Filed: Mar. 12, 2020

(65) Prior Publication Data

US 2021/0288655 A1 Sep. 16, 2021

(51) Int. Cl.
G04F 10/00 (2006.01)
H03L 7/181 (2006.01)
H03L 7/183 (2006.01)

(52) U.S. Cl.
CPC ............ *H03L 7/181* (2013.01); *G04F 10/005* (2013.01); *H03L 7/183* (2013.01)

(58) Field of Classification Search
CPC . H03L 7/181; H03L 7/183; H03L 7/18; G04F 10/005
See application file for complete search history.

(56) References Cited

U.S. PATENT DOCUMENTS

| 3,970,828 A | 7/1976 | Klein |
| 4,942,561 A | 7/1990 | Ohishi et al. |
| 5,940,467 A | 8/1999 | Fransson |
| 5,942,902 A | 8/1999 | Okayasu |
| 6,548,997 B1 | 4/2003 | Bronfer et al. |
| 6,639,538 B1 | 10/2003 | Sechi et al. |
| 6,754,613 B2 | 6/2004 | Tabatabaei et al. |
| 6,980,614 B2 | 12/2005 | Miller et al. |
| 7,525,878 B2 | 4/2009 | Watanbe |
| 7,979,228 B2 | 7/2011 | Zurbuchen et al. |
| 8,219,346 B2 | 7/2012 | Zurbuchen et al. |

(Continued)

FOREIGN PATENT DOCUMENTS

| DE | 698 14 931 T2 | 5/2004 |
| JP | H 05-88077 A | 4/1993 |
| WO | WO 99-60496 A1 | 11/1999 |

OTHER PUBLICATIONS

Anderson et al., "The Detection of Incipient Faults in Transmission Cables Using Time Domain Reflectometry Techniques: Technical Challenges;" IEEE Transactions on Power Apparatus and Systems, vol. PAS-101, No. 7; Jul. 1982; 7 Pages.

(Continued)

*Primary Examiner* — Jung Kim
(74) *Attorney, Agent, or Firm* — Daly Crowley Mofford & Durkee, LLP

(57) ABSTRACT

Methods and apparatus for generating phase-shifted clock signals from a reference clock, connecting the phase-shifted clock signals to a counter module so that the phase-shifted clock signals change values in counters in the counter module, and combining the values in the counters to generate an output signal corresponding to an amount of time. One or more events can be detected at a time corresponding to the output signal. In embodiments, pulses can be transmitted and received at a measure time to evaluate connected devices.

21 Claims, 11 Drawing Sheets

(56) References Cited

U.S. PATENT DOCUMENTS

| | | |
|---|---|---|
| 8,847,637 B1* | 9/2014 | Guyton .................. H03K 23/58 |
| | | 327/115 |
| 8,874,999 B1 | 10/2014 | Taylor et al. |
| 9,995,820 B2 | 6/2018 | Jachmann et al. |
| 10,185,032 B2 | 1/2019 | Stutz et al. |
| 2003/0076444 A1 | 4/2003 | Bohm et al. |
| 2004/0140828 A1 | 7/2004 | Confalonieri et al. |
| 2005/0184777 A1 | 8/2005 | Stoops et al. |
| 2005/0216780 A1 | 9/2005 | Sunk et al. |
| 2012/0093277 A1 | 4/2012 | Hizu |
| 2012/0253721 A1 | 10/2012 | Cohen et al. |
| 2013/0089175 A1 | 4/2013 | Mo et al. |
| 2014/0258764 A1 | 9/2014 | Kwak |
| 2015/0323654 A1 | 11/2015 | Jachmann et al. |
| 2018/0113160 A1 | 4/2018 | Warburton et al. |
| 2018/0113203 A1 | 4/2018 | Warburton |
| 2020/0321969 A1* | 10/2020 | Janardhanan ........... H03L 7/083 |
| 2021/0044299 A1* | 2/2021 | Tertinek ................ G04F 10/005 |

OTHER PUBLICATIONS

Audino et al., "FPGA/DSP-based Configurable Multi-Channel Counter;" 10$^{th}$ Euromicro Conference on Digital System Design Architectures, Methods and Tools (DSD 2007); Aug. 29-31, 2007; 7 Pages.

Auzanneau, "Chaos Time-Domain Reflectometry for Distributed Diagnosis of Complex Topology Wires Networks;" Electronics Letters, vol. 52, No. 4; Feb. 18, 2016; pp. 280-281; 2 Pages.

Bajaj, "Exploiting DSP Block Capabilities in FPGA High Level Design Flows;" Ph.D. Thesis Submitted to School of Computer Engineering at Nanyang Technological University; Jul. 30, 2016; 230 Pages.

Baronti et al., "60-Channel High-Resolution Counter Array for High-Speed Continuous Long-Term Data Acquisition;" 2005 12th IEEE International Conference on Electronics, Circuits and Systems; Dec. 11-14, 2005; 4 Pages.

Beklemishev et al., "The Usage of PLD PLL Blocks for Wideband Pulse Signal Detection;" 2017 IEEE Conference of Russian Young Researchers in Electrical and Electronic Engineering (EIConRus); Feb. 1-3, 2017; 2 Pages.

Benchoff, "Counting Really, Really Fast with an FPGA;" Article from Hackaday Website (https://hackaday.com); Jun. 29, 2014; 18 Pages.

Boven, "Increasing the Resolution of Reciprocal Frequency Counters;" Retrieved from https://www.febo.com/pipermail/time-nuts/attachments/20071201/e7833af5/attachment.pdf; Dec. 1, 2007;9 Pages.

Chen et al., "A CMOS Pulse-Shrinking Delay Element for Time Interval Measurement;" IEEE Transactions on Circuits and Systems—II: Analog and Digital Signal Processing, vol. 47, No. 9; Sep. 2000; 5 Pages.

Chen et al., "A High-Precision Counter Using the DSP Technique;" Proceedings of the 35th Annual Precise Time and Time Interval Systems and Applications Meeting; Dec. 2-4, 2003; 9 Pages.

Chua et al., "FPGA-Based Chirp Generator for High Resolution UAV SAR;" Progress in Electromagnetics Research (PIER), vol. 99; Jan. 2009; pp. 71-88; 18 Pages.

Cioffi, "Signal Processing and Detection;" Part I from *Communication/Signal Processing: Data Transmission Theory*; Accessed Sep. 3, 2019; 101 Pages.

Corey et al., "Interconnect Characterization Using Time Domain Reflectometry;" IEEE Transactions on Microwave Theory and Techniques, vol. 43, Issue 9; Sep. 1995; 3 Pages.

Cui et al., "A High-Linearity Time-to-Digital Converter Based on Dynamically Delay-Adjustable Looped Carry Chains on FPGAs;" Abstract Only; AIP Review of Scientific Instruments, vol. 89, Issue 8; Published Online Aug. 14, 2018; 8 Pages.

Dudáček, "Short Time Delay Measurement;" Technical Report No. DCSE/TR-2015-03 of University of West Bohemia in Pilsen; Jul. 2015; 44 Pages.

Farahman, "Digital Baseband Modulation;" Sonoma State, CES540 Class Lecture—Chapter 9; Retrieved from: http://web.sonoma.edu/users/f/farahman/sonoma/courses/ces540/lectures/Chapter9_Dig_Digital_Modualtion.pdf <Chapter9_Dig_Digital_Modualtion.pdf>; Accessed on Sep. 3, 2019; 32 Pages.

Fries et al., "High-Precision TDS in an FPGA Using a 192-MHz Quadrature Clock;" 2002 IEEE Nuclear Science Symposium Conference Record.; Published Jan. 1, 2002; 5 Pages.

Hellman, "Low Cost Embedded Accurate 6 GHz RF Frequency Counter;" Master's Thesis Submitted to Department of Electrical and Information Technology of Lund University; May 26, 2017; 67 Pages.

Hewlett Packard, "Fundamentals of Time Interval Measurements;" Application Note 200-3; Electronic Counter Series; 68 Pages.

Hoai et al., "Fault Detection on the Transmission Lines Using the Time Domain Reflectometry Method Basing on the Analysis of Reflected Waveform;" IEEE International Conference on Sustainable Energy Technologies (ICSET); Nov. 14-16, 2016; 5 Pages.

Honjo, "Gigahertz Clocked Quantum Key Distribution System using FPGA;" 2009 35th European Conference on Optical Communication (ECOC); Sep. 20-24, 2009; 2 Pages.

Izydorczyk, "Microwave Time Domain Reflectometry;" Electronics Letters, vol. 41, No. 15; Jul. 21, 2005; 2 Pages.

Jorion et al., "High-Speed Pulse Height Analyzer for Downhole Spectroscopic Applications;" IEEE Nuclear Science Symposium and Medical Imaging Conference Record (NSS/MIC); Oct. 27, 2012; 10 Pages.

Kakuru, "Design of On-Chip Monitoring Circuits for Clock Delay and Temperature;" Partial Fulfillment of Requirements for the Degree of Master of Engineering in Electrical Engineering and Computer Science at the Massachusetts Institute of Technology; Jun. 2016; 82 Pages.

Kalisz, "Review of Methods for Time Interval Measurements with Picosecond Resolution;" Article in Metrologia, vol. 41, No. 1; Published Dec. 10, 2003; pp. 17-32; 16 Pages.

Kastner et al., "Parallel Programming for FPGAs;" The HLS Book; May 11, 2018; http://hlsbook.ucsd.edu; 235 Pages.

Khan et al., "Real-Time Edge Detection and Range Finding Using FPGAs;" Article in Optik, vol. 126, Issue 17; Sep. 2015; pp. 1545-1550; 6 Pages.

Khurshid et al., "High Efficiency Generalized Parallel Counters for Look-Up Table Based FPGAs;" Research Article from International Journal of Reconfigurable Computing, vol. 2015; 17 Pages.

Knežević et al., "A Single Chip Solution for Pulse Transmit Time Measurement;" Conference Paper from 2013 IEEE 13th International Conference on Bioinformatics and Bioengineering (BIBE); Nov. 2013; 4 Pages.

Kostamovaara et al., "A Receiver—TDS Chip Set for Accurate Pulsed Time-of-Flight Laser Ranging;" CDNLive!—EMEA Cadence User Conference; May 14-16, 2012; 6 Pages.

Kuroki et al., "Range Finding by Using NRD Guide Pulse Radar Front-End at 60 GHz;" Proceedings of the 3$^{rd}$ European Radar Conference; Sep. 2006; 4 Pages.

Lee et al., "Condition Monitoring of Cable Aging via Time-Frequency Domain Reflectometry in Real-Time;" IEEE Conference on Electrical Insulation and Dielectric Phenomenon (CEIDP); Oct. 2017; 5 Pages.

Li et al., "Influence of Waveform Characteristics on LiDAR Ranging Accuracy and Precision;" Article in Sensors, vol. 18, No. 4; Published Apr. 10, 2018; 19 Pages.

Magdaleno et al., "Acceleration of Computation Speed for Wavefront Phase Recovery Using Programmable Logic;" Open Access Peer-Reviewed Chapter from book *Topics in Adaptive Optics*; Published Jan. 20, 2012; 16 Pages.

Mäntyniemi, "An Integrated CMOS High Precision Time-to-Digital Converter Based on Stabilised Three-Stage Delay Line Interpolation;" Academic Dissertation from Department of Electrical and Information Engineering at University of Oulu for Public Discussion on Dec. 3, 2004; 88 Pages.

Mohsin, "An FPGA-Based Hardware Accelerator for K-Nearest Neighbor Classification for Machine Learning;" Thesis Submitted in Partial Fulfillment of the Requirements for the Degree of Master of Science at University of Colorado; Nov. 15, 2017; 84 Pages.

(56) References Cited

OTHER PUBLICATIONS

Neto et al., "Decimal Multiplier on FPGA Using Embedded Binary Multipliers;" 2008 International Conference on Field Programmable Logic and Applications; Sep. 8-10, 2008; 6 Pages.
Nilsson et al., "Combining Physical and Digital Evidence in Vehicle Environments;" Third International Workshop on Systematic Approaches to Digital Forensic Engineering; May 22, 2008; 5 Pages.
Niranjan et al., "FPGA Based Implementation of Pulse Parameters Measurement;" Proceedings of Science and Information Conference; Aug. 27-29, 2014; 6 Pages.
Ohki et al., "Detection of Abnormality Occurring Over the Whole Cable Length by Frequency Domain Reflectometry;" IEEE Transactions on Dielectrics and Electrical Insulation, vol. 25, No. 6; Dec. 2018; 3 Pages.
Ohki et al., "Influence of Cable Structure on the Fault Location by Frequency Domain Reflectometry;" 2015 Annual Report Conference on Electrical Insulation and Dielectric Phenomena (CEIDP); Oct. 18-21, 2015; 4 Pages.
ON Semiconductor, "MC100EP016A: ECL 8-Bit Synchronous Binary Counter;" Rev. 9; Semiconductor Components Industries, LLC; Retrieved from: https://www.onsemi.com/pub/Collateral/MC100EP016A-D.PDF; Mar. 2008; 2 Pages.
Prajapati et al., "Determination of Impedance Mismatch in Transmission Line Using Developed TDR;" Proceedings of the International Conference on Communication and Electronics Systems (ICCES 2018); Oct. 15-16, 2018; 4 Pages.
QSL.Net, "13 GHz Frequency Counter Prescaler;" Retrieved from https://www.qsl.net/n9zia/pre1/index.html on Apr. 15, 2019; 11 Pages.
Ronak et al., "Mapping for Maximum Performance on FPGA DSP Blocks;" IEEE Transactions on Computer-Aided Design of Integrated Circuits and Systems; May 18, 2016; 14 Pages.
Shen et al., "A 1.7 ps Equivalent Bin Size and 4.2 ps RMS FPGA TDDC Based on Multichain Measurements Averaging Method;" IEEE Transactions on Nuclear Science, vol. 62, No. 3; Jun. 2015; 8 Pages.
Smith, "Programmable ASIC I/O Cells;" ASICs . . . The Course—Section 6; Intel MAX 10 General Purpose I/O User Guide; http://www.csit-sun.pub.ro/resources/asic/CH06.pdf; Jan. 1997; 22 Pages.
Song et al., "A High-Resolution Time-to-Digital Converter Implemented in Field-Programmable-Gate-Arrays;" IEEE Transactions on Nuclear Science, vol. 53, No. 1; Feb. 2006; 6 Pages.
Stojkovic et al., "Dual-Mode Digital Revolution Counter;" IEEE Instrumentation and Measurement Technology Conference; May 21-23, 2001; 5 Pages.
Tolescu et al., "Characterization of Differential Interconnects from Time Domain Reflectometry Measurements;" 24th International Spring Seminar on Electronics Technology (ISSE 2001); May 5-9, 2001; 4 Pages.
Vijeyakumar et al., "Design of High Speed Low Power Counter Using Pipelining;" Journal of Scientific & Industrial Research, vol. 73; Feb. 2014; pp. 117-123; 7 Pages.
Vliegen, "Partial and Dynamic FPGA Reconfiguration for Security Applications;" Dissertation Presented in Partial Fulfillment of the Requirements for the Degree of Doctor in Engineering Technology; Jun. 2014; 180 Pages.
Von Herzen, "Signal Processing at 250 MHz Using High-Performance FPGA's;" IEEE Transactions on Very Large Scale Integration (VLSI) Systms, vol. 6, No. 2; Jun. 1998; 8 Pages.
Wang et al., "A Multi-Chain Merged Tapped Delay Line for High Precision Time-to-Digital Converters in FPGAs;" IEEE Transactions on Circuits and Systems—II: Express Briefs, vol. 65, No. 1; Jan. 2018; 5 Pages.

Wu et al., "Firmware-only Implementation of Time-to-Digital Converter (TDC) in Field-Programmable Gate Array (FPGA);" Proceedings of FERMILAB-Conf-03/358-E; Nov. 2003; 5 Pages.
Xilinx, "Can any FPGA support FF and shift register clock at 1GHz?;" Community Forum on https://forums.xilinx.com; Posted Jun. 4, 2015; 10 Pages.
Xilinx, "7 Series FPGAs SelectIO Resources;" User Guide—UG471 (v1.10); May 8, 2018; 188 Pages.
Xilinx, "7 Series DSP48E1 Slice;" User Guide—UG479 (v1.10); Mar. 27, 2018; 58 Pages.
Xilinx, "7 Series FPGAs PCB Design Guide;" User Guide—UG483 (v1.14); May 21, 2019; 76 Pages.
Xilinx, "UltraScale Architecture SelectIO Resources;" User Guide—UG571 (v1.12); Aug. 28, 2019; Part 1 of 3; 150 Pages.
Xilinx, "UltraScale Architecture SelectIO Resources;" User Guide—UG571 (v1.12); Aug. 28, 2019; Part 2 of 3; 150 Pages.
Xilinx, "UltraScale Architecture SelectIO Resources;" User Guide—UG571 (v1.12); Aug. 28, 2019; Part 3 of 3; 60 Pages.
Xilinx, "UltraScale Architecture PCB Design;" User Guide—UG583 (v1.18); Nov. 26, 2019; Part 1 of 3; 110 Pages.
Xilinx, "UltraScale Architecture PCB Design;" User Guide—UG583 (v1.18); Nov. 26, 2019; Part 2 of 3; 110 Pages.
Xilinx, "UltraScale Architecture PCB Design;" User Guide—UG583 (v1.18); Nov. 26, 2019; Part 3 of 3; 106 Pages.
Yingqing et al., "Research On High Precision TDC for Measuring the Continuous Pulses;" Conference Paper from International Conference on Mechatronics, Electronic, Industrial and Control Engineering (MEIC 2015); Jan. 2015; 4 Pages.
Yonggang et al., "Two Novel Designs of Multi-Phase Clocked Ultra-High Speed Time Counter on FPGA for TDC Implementation;" 2013 IEEE Nuclear Science Symposium and Medical Imaging Conference (NSS/MIC); Oct. 2013; 4 Pages.
Yu et al., "Design of a Lower Power Wide-Band High Resolution Programmable Frequency Divider;" IEEE Transactions on Very Large Scale Integration (VLSI) Systems, vol. 13, No. 9; Sep. 2005; 6 Pages.
Zeng et al., "Researches of the Digital Timing Spectrometer Based on DSP Builder and FPGA;" 2014 19th IEEE-NPSS Real Time Conference; May 26-30, 2014; 4 Pages.
Zhang et al., "A 7.4 ps FPGA-Based TDC with a 1024-Unit Measurement Matrix;" Article in Sensors, vol. 17, No. 4; Apr. 2017; 28 Pages.
Zou, "A High Speed and Multichannel Data Acquisition System for the ARIANNA High Energy Neutrino Detector;" Dissertation Submitted in Partial Satisfaction of the Requirements for the Degree of Doctor of Philosophy in Electrical and Computer Engineering; Jan. 2013; Part 1 of 2; 80 Pages.
Zou, "A High Speed and Multichannel Data Acquisition System for the ARIANNA High Energy Neutrino Detector;" Dissertation Submitted in Partial Satisfaction of the Requirements for the Degree of Doctor of Philosophy in Electrical and Computer Engineering; Jan. 2013; Part 2 of 2; 80 Pages.
International Invitation to Pay Additional Fees and, where applicable, Protest Fee dated Apr. 12, 2021 for International Application No. PCT/US2020/065019; 14 Pages.
Zhang et al. "A Field Programmable Gated Array-Based Method for Performing High-Precise Instantaneous Burst Carrier Frequency Measurement;" Review of Scientific Instruments, AIP, Melville, NY, US, vol. 85, No. 6, Jun. 17, 20114; 6 Pages.
International Search Report and Written Opinion dated Jun. 2, 2021 for International Application No. PCT/US2020/065019; 21 Pages.

* cited by examiner

HIGH RESOLUTION COUNTER USING PHASED SHIFTED CLOCK

BACKGROUND

As is known in the art, counters can be used to determine an amount of time that has expired until an event has occurred. Developing counters in digital integrated circuit technologies that have sufficiently large bit lengths to achieve desired accuracy and precision may be challenging when operated at sufficiently high clock frequencies.

In addition, verification of the correctness or integrity of signal traces on individual circuit card assemblies (CCAs) or Printed Circuit Boards (PCBs) as produced may be difficult to achieve. Capabilities that can identify faulty assemblies in production, test, and then later in the field can save industry considerable expense while improving the reliability and utility of the products. Also, a major source of in system failures in deployed systems is due to cabling problems and loose or faulty connectors.

Moreover, there is not a current common widely adapted methodology or capability to verify the connections and trace lengths or other observable physical properties of signals that connect to each of the I/O pins of semiconductor devices or to verify the connections, as well as physical properties, of signals that connect assemblies and subsystems together.

SUMMARY

Embodiments of the invention provide methods and apparatus for a high speed counter and/or measurement circuit having sufficient bit lengths to achieve desired characteristics when operating at sufficiently high clock frequencies. In embodiments, a system having counters and adders can describe 100 ps times or less while counting with greater than gigabit resolution. It will be appreciated that achieving accuracy and precision may be challenging. Accuracy refers to closeness of measurements to a specific value. Precision refers to the closeness of the measurements to each other. That is, precision can be considered a description of random errors.

The counters facilitate precision of measurements and characterization of certain events. In some embodiments, counters can determine response times of signal components used to measure reflection characterizations associated with systems and assemblies. For, example, the response characteristics of "as fabricated" systems and assemblies can be accurately measured. In embodiments, example counters are implemented in FPGAs (Field Programmable Gate Arrays).

In example embodiments, FPGA resources are used to create a tree of N phase shifted clocks, each phase shifted from one another in sequence by 360 degrees divided by N. By doing this, a relatively lower frequency clock period can be portioned in time into fine time segments. Then each of these low frequency clocks, offset by that phase shift, can be used to count times until a transition or terminal event occurs with the earliest transition count representing the actual fine time measurement.

In another aspect, a system having phase-shifted clock signals can measure one or more events with enhanced accuracy and/or precision as compared with conventional systems. In some embodiments, a system measures I/O trace connections to system processing devices. Trace integrity and correctness can be verified. For components, such as Field Programmable Gate Array (FPGA) devices, the problem of verification of the correctness or integrity of signal traces for any of the Input/Output (I/O) signals to or from the device is solved by application of reconfigurable signal measurement sensor technology systematically inserting and connecting measurement circuitry to each of the I/O of the device, measuring the properties of the physical signal trace of wire connected to that I/O in situ, and then removing or replacing that function with the normal application circuitry used in the device. Expected baseline behavior can be determined during design and simulation with precise results measured during an initial characterization of the assembly or subsystem, measured again as warranted during boot, or monitored in a recurring manner if necessary. This can be accomplished during test, at system start-up, as might be commanded during a Built-in-Test (BIT) operation, when necessary to troubleshoot a system.

In embodiments, to measure the effective length of signal traces or wires, a known signal is sent out. The system measures the minimum response time due to reflection from the terminal end of that signal trace or wire. Even if that end is properly terminated to cancel reflections, that is only accomplished for specific frequencies and so proper selection of the test signal can ensure that reflection terms are measurable.

In an example implementation, a system generates one or a series of pulse signals from a pulse source connected to a transmit I/O circuit, which is connected to a transmit pin of the device. A receive pin of the device is connected to a receiver I/O circuit, which is connected to circuitry to a measurement circuit. One or more clocks is provided to the pulse source and measurement circuit along with control logic, memory, and control instructions to effect measurements of the transmitted and received pulses.

In one aspect, a method comprises: generating phase-shifted clock signals from a reference clock; connecting the phase-shifted clock signals to a counter module so that the phase-shifted clock signals change values in counters in the counter module; and combining the values in the counters to generate an output signal corresponding to an amount of time.

A method can include one or more of the following features: the phase-shifted clocks have a selected phase shift, the phase-shifted clock signals cover 360 degrees with respect to the reference clock, each of the phase-shifted clock signals increments a respective one of the counters in the counter module, values from pairs of the counters are summed together, the output signal corresponds to a sum of values from each of the counters, a phase locked loop is used to generate the phase-shifted clock signals, inverting splitters coupled to the phase-shifted clock signals to generate an inverted signal and a non-inverted signal that are connected to different ones of the counters, programming a Field Programmable Gate Array (FPGA) to perform the steps of: generating phase-shifted clock signals from a reference clock; connecting the phase-shifted clock signals to a counter module so that the phase-shifted clock signals change values in counters in the counter module; and combining the values in the counters to generate an output signal corresponding to an amount of time, programming macros for the FPGA in parallel, the output value describes millisecond times and the counters provide greater than gigabit resolution, transmitting a pulse to an externally connected device and receiving the transmitted pulse, measuring a time from transmitting the pulse to receiving the transmitted pulse, wherein the measured time corresponds to the combined values in the counters, wherein the measured time corresponds to a distance including signal traces, identifying faults based on the measured time, identifying an unexpected component in the connected device based on the measured time, the transmitted pulse is generated from one or more of the phase-shifted clocks, comparing the measured time to a value and generating a signal indicative of the comparison, comparing the measured time for a bootup sequence and generating a signal indicative of the comparison, and/or transmitting encoded pulses to an externally connected device, receiving the encoded pulses, decoding the encoded pulses, and comparing the decoded pulses with a stored version of the transmitted encoded pulses.

BRIEF DESCRIPTION OF THE DRAWINGS

The foregoing features of this invention, as well as the invention itself, may be more fully understood from the following description of the drawings in which.

DETAILED DESCRIPTION

Figure 1:
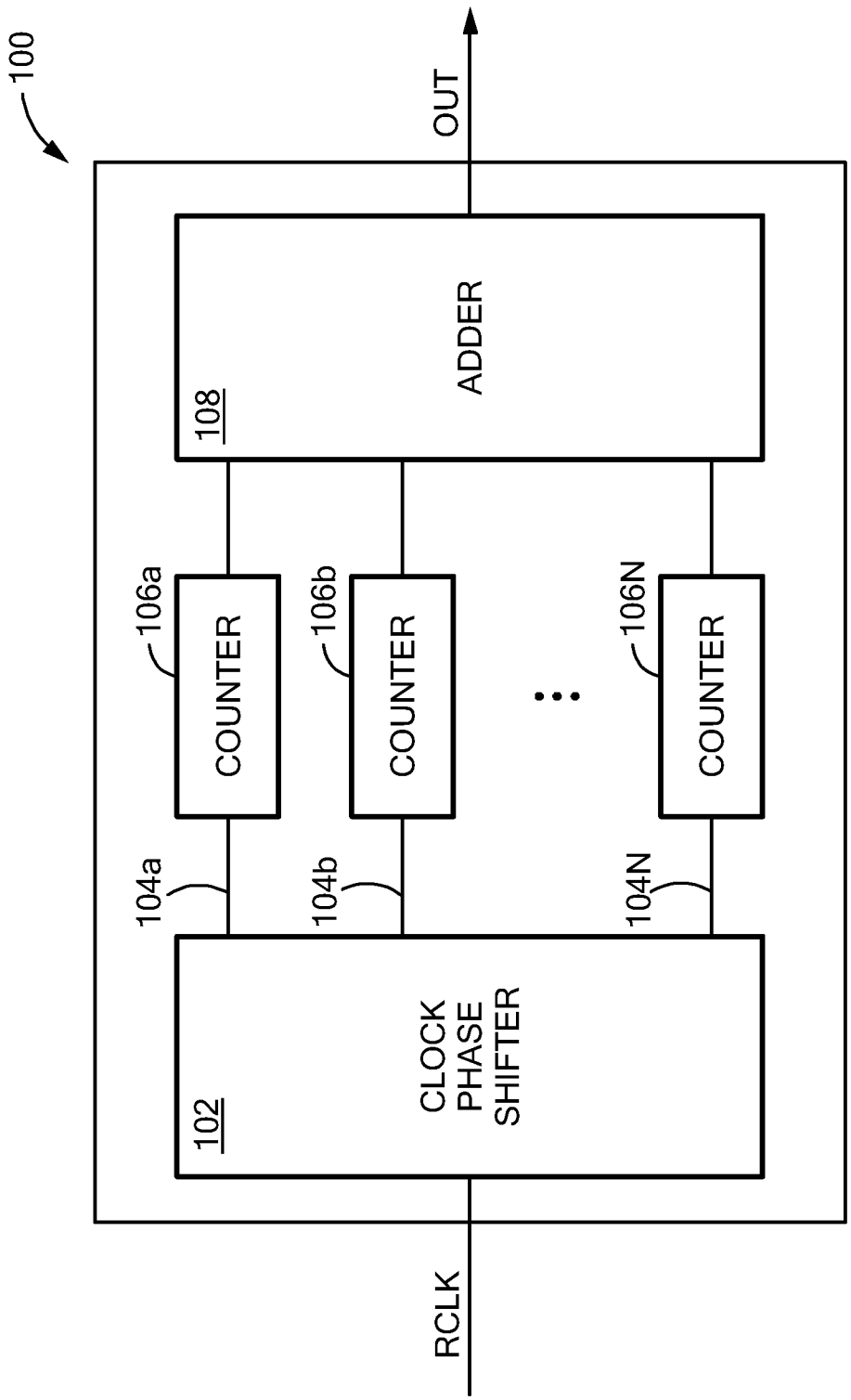
FIG. 1 is a high-level block diagram of an example timing system in accordance with example embodiments of the invention.

FIG. 1 shows an example timing system 100 having a clock phase shifter module 102 that can receive a reference clock RCLK and generate phase-shifted clock signals 104a-N, each shifted in phase from the reference clock by some amount. Each of the phase-shifted clock signals 104a-N can be coupled to a respective counter module 106a-N. In embodiments, each rising edge of the phase-shifted clock signal s 104a-N increments the respective counter module 106a-N. An adder module 108 receives the values from the counter modules 106a-N and sums the values and outputs a value corresponding to total number of clock edges of the phase-shifted clock signals 104a-N.

It is understood that the phase-shifted clocks can be shifted by any practical amount to meet the needs of a particular application. It is further understood that there can be less than one counter per phase-shifted clock as long as the counter increments for each received pulse. In addition, counters can increment or decrement as desired.

Figure 2:
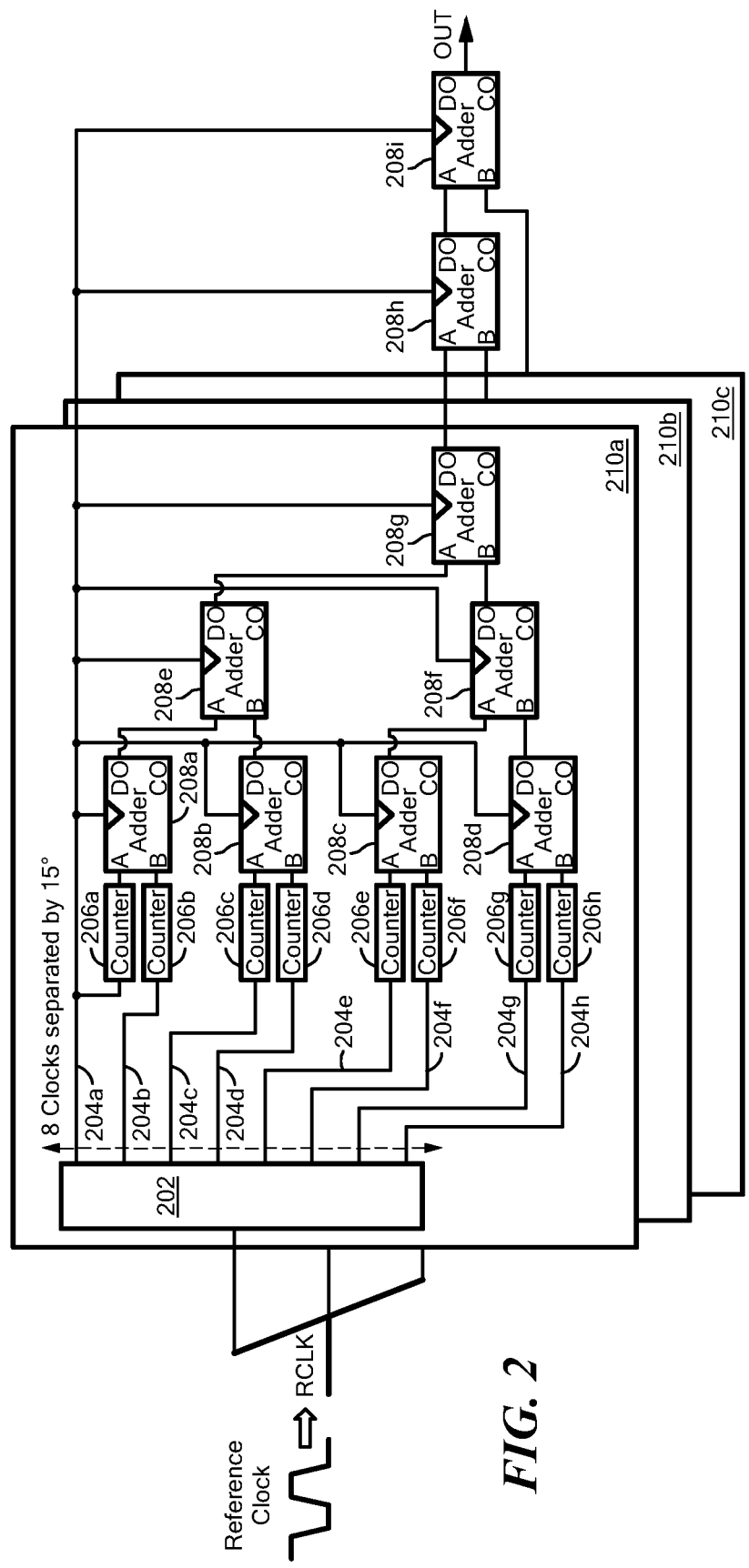
FIG. 2 is a block diagram showing additional detail of the example timing system of FIG. 1.

FIG. 2 shows an example implementation of the timing system 100 of FIG. 1 using three phase shift modules. A reference clock RCLK having a selected frequency, such as 100 MHz, is received by a phase shifter module 202 which generates eight clocks signals 204a-h each separated by fifteen degrees. The phase-shifted first clock signal 204a is coupled to a first counter 206a, the phase-shifted second clock signal 204b is coupled to a second counter 206b, and so on, until the phase-shifted eighth clock signal 204h is coupled to the eighth counter 206h. It should be noted that the phase-shifted first clock signal 204a on module 210a may not be shifted in phase with respect to the reference clock RCLK received by the phase shifter module. The base phase 204a on each of the modules 210a-c, is offset from RCLK by 360 degrees divided by the number of phase shifters employed. In this example, three are used so each is offset by 120 degrees in succession from one another.

The total number of phases possible is determined by the number of clock routing resources that can be allocated as constrained by physical implementation limits of the silicon device. In this example implementation, a total of twenty four clock routing tracks are available and hence, using three phase shifter circuits, each be used to create eight phase-shifted second clock signals 204a-h. Consequently, module 210a, phase shifter circuit 202 phase-shifted clock 204a is offset by 0 degrees, whereas module 210b phase-shifted clock 204a on is offset from RCLK by 120 degrees and module 210c phase-shifted clock 204a is offset from RCLK by 240 degrees. Note that each phase-shifted clock 204a-h on each module 210a-c is an identical clock to RCLK, running at the same frequency as RCLK however shifted in time accordingly by their individual phase offset.

The clocks 204a-h and adders 208a-g cover 120 degrees, which is one third of a 360 cycle. It will be appreciated that 360 degrees divided by 15 degrees is 24 so that 24 clocks should be generated. In the illustrated embodiment, a first module 210a including the clocks 204a-h and adders 208a-g generate a third of the total sum. A second module 210b and a third module 210c, which may be substantially similar to the first module 210a, each cover 120 degrees.

The first and second counter modules 206a,b are coupled to respective inputs of a first adder module 208a. In embodiments, the first adder 208a adds the value from the first counter module 206a and the value from the second counter module 206b. Similarly, a second adder 208b adds the values of the third and fourth counters 206c,d, a third adder 208c adds the values of the fifth and sixth counters 206e,f, and a fourth adder 208d adds the values of the seventh and eighth counters 206g,h. The output values of the first and second adders 208a,b are summed by a fifth adder 208e and the output values of the third and fourth adders 208c,d are summed by a sixth adder 208f. The outputs of the fifth and sixth adders 208e,f are summed by a seventh adder 208g. Note that if the hardware macros used to implement adders are of sufficient bit width, then add carry bits need not be propagated width wise from block to block.

In an example embodiment, an eight adder 208h sums the values for the first and second modules 210a,b and a ninth adder 208i sums the output from the eight adder 208h and a value from the third module 210c. The output OUT of the ninth adder 208i provides the sum of all the counters from each of the modules 210 covering 360 degrees.

In example embodiments, one of the phase-shifted clocks, arbitrarily chosen as first clock signal 204a from module 210a, is provided to counters 208h,i.

With this arrangement, at any given time, the output value OUT for the system 200 represents a count corresponding to an amount of time from the when zeroed out counters 206 begin to increment. The output value provides enhanced accuracy and precision compared with conventional systems that generate signals from a reference clock.

Figure 2A:
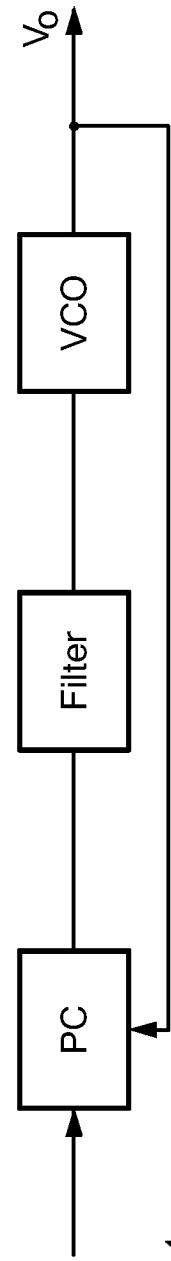
FIG. 2A shows an example phase locked loop that can form at part of the system of FIG. 2.

In some embodiments, the phase shifter module 202 comprises a phase-locked loop (PLL). It is understood that any suitable circuit implementation can be used to provide phase-shifted clocks. FIG. 2A shows an example PLL having an input signal, such as a reference clock RCLK, input to a phase comparator PC the output of which is filtered by a filter. A voltage-controlled oscillator VCO generates a phase-shifted output Vo, which is fed back to the phase comparator PC. The VCO can control the phase shift of the output signal Vo in relation to the input signal. Any practical number of PLLs can be used to provide the desired number of phase-shifted clocks.

Figure 3A:
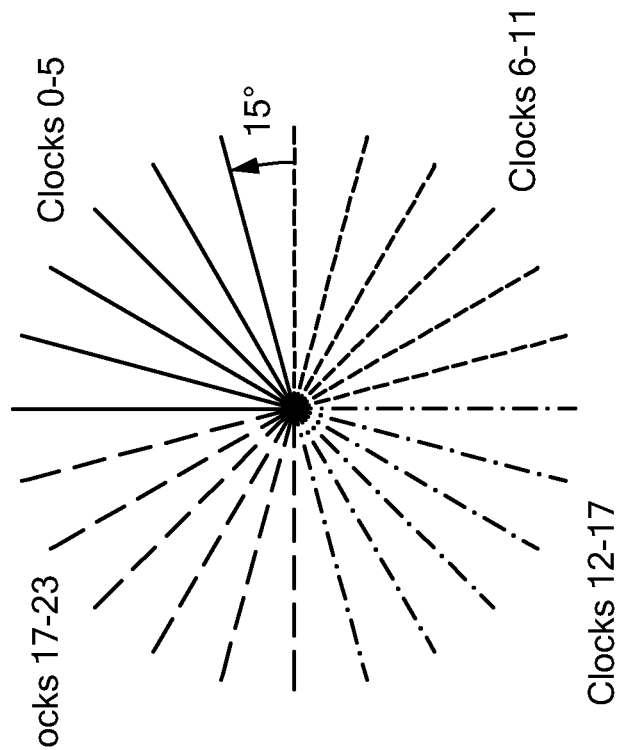
FIG. 3A is a graphical representation of 24 clock signals separate in phase by 15 degrees generated by three modules.
Figure 3B:
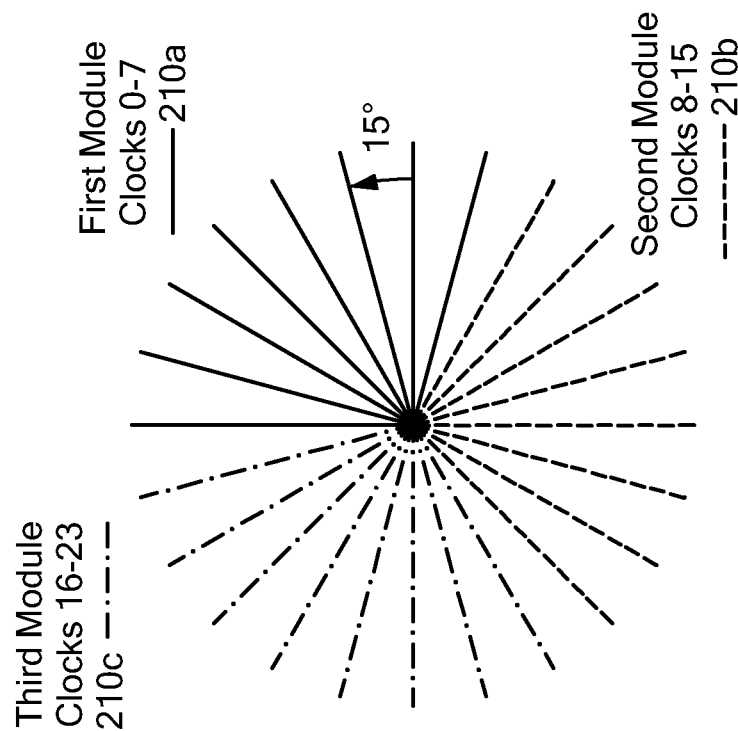
FIG. 3B is a graphical representation of 24 clock signals separate in phase by 15 degrees generated by four modules.

FIG. 3A is a graphical representation of the clock signals 204 from the first, second, and third modules 210a,b,c spanning 360 degrees separated by 15 degrees. Each of the first, second and third modules 210a,b,c provide a third, e.g., 120 degrees, of the clock signals. FIG. 3B shows an alternative embodiment where four groups of clocks are generated by respective modules where each of the clocks is shifted 15 degrees in phase.

Figure 4:
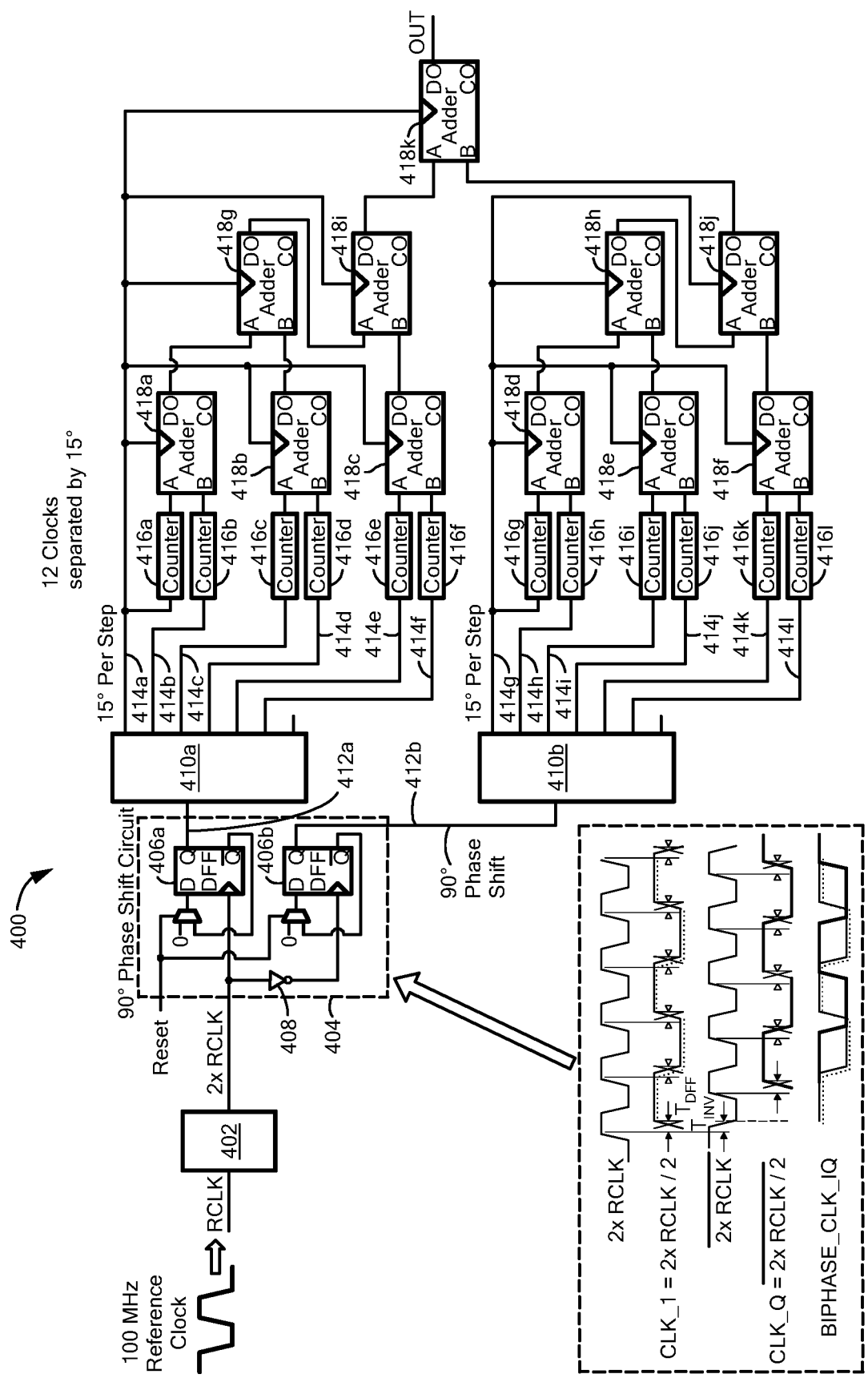
FIG. 4 is a block diagram showing a further embodiment of a timing system.

FIG. 4 shows another embodiment of a timing system 400 having phase-shifted clocks where a 90 degree phase shift is implemented to generate some of the clock signals. A reference clock RCLK is provided to a phase shifter module 402 that outputs a clock signal 2RCLK having a frequency that is double the frequency of RCLK. The clock signal 2RCLK is provided to phase shift module 404, which has first and second flip flop circuits 406a,b. The clock signal 2RCLK is provided to the first flip flop circuit 406a and an inverted 408 shifted clock signal/2RCLK is provided to the second flip flop circuit 406b. The first flip flop circuit 406a outputs a clock signal 412a corresponding to RCLK to a first phase shifter module 410a and the second flip flop circuit 406b outputs a clock signal 412b corresponding to RCLK shifted by 90 degrees.

Example clock signal waveforms are shown in the lower left of FIG. 4. The output 2RCLK of the shifter module 402 is shown. A CLK_I signal, which is input to the first phase shifter module 410a, is shown as 2×RCLK/2, which has the same frequency as RCLK. A signal/2×RCLK, which is inverted 2RCLK, is input to the second flip flop circuit 406b. CLK_Q is shown as /2×RCLK/2, which is shifted 90 degrees from CLK_I. The combination of the two signals can be viewed as the In-phase and Quadrature components of the complex signal, biphase_CLK_IQ where CLK_I is the Inphase component and CLK_Q is the quadrature component. This biphase_CLK_IQ signal is shown for reference, overlaying CLK_I and CLK_Q.

In the illustrated embodiment, the first phase shifter module 410a outputs six phase-shifted clocks 414a-f and the second phase shifter module 410b, which receives the 90 degree shifted clock CLK_Q, outputs six phase-shifted clocks 414g-l. In this embodiment, twelve clock signals 414a-l are generated each separated in phase by 15 degrees, which covers 180 degrees. A similar circuit can cover the other 180 degrees.

A series of counters 416a-l are coupled to the respective ones of the first and second phase shifter modules and a series of cascaded adders 418a-k are coupled to sum the values from the counters 416, in a manner described above.

Figure 5:
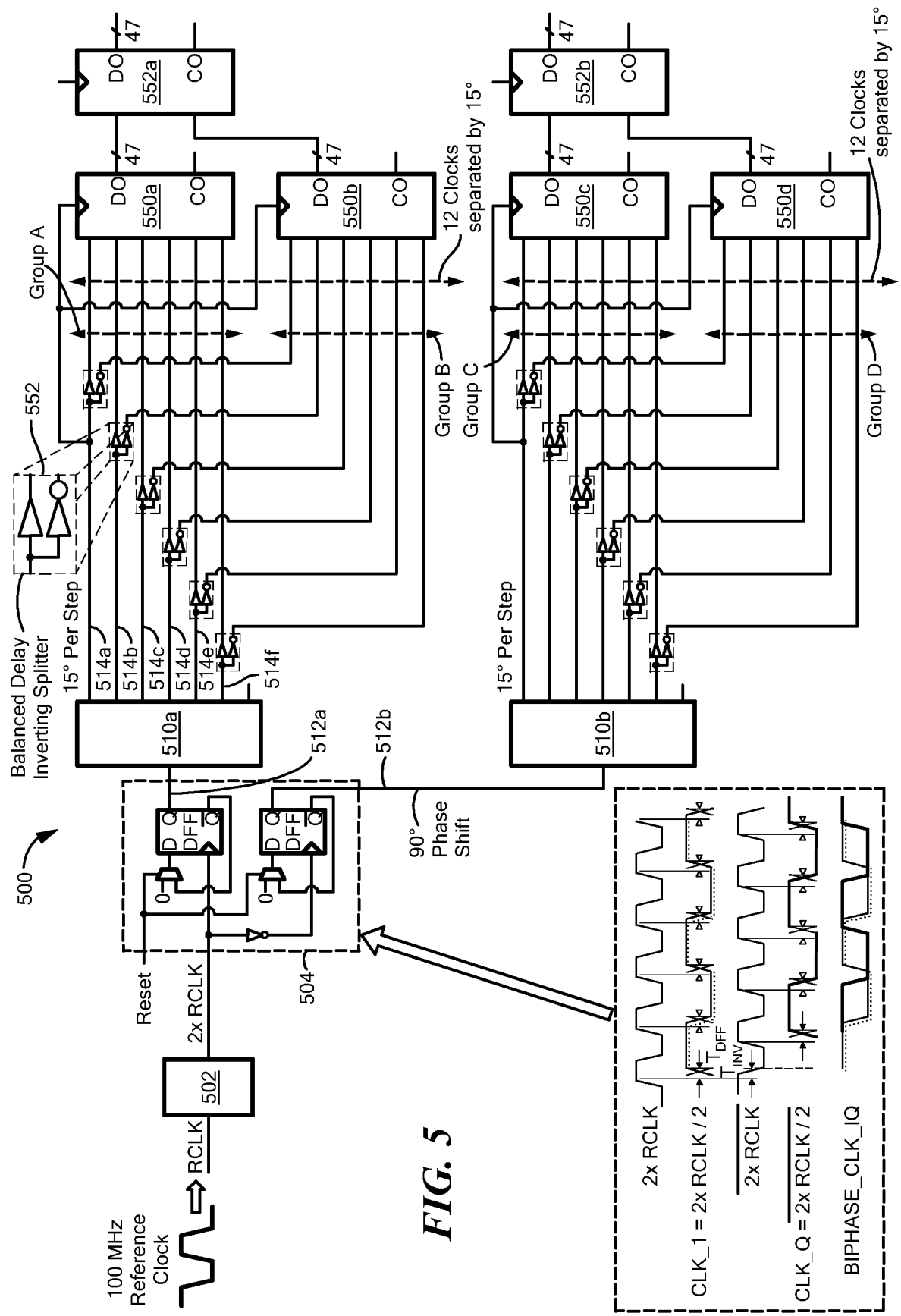
FIG. 5 is a block diagram showing a further embodiment of a timing system.

FIG. 5 shows another example embodiment of a timing system 500 using phase-shifted clocks. A shifter module 502 receives reference clock RCLK and outputs 2RCLK. A flip flop circuit 504 generates a first clock 512a and a second clock 512b, which is shifted 90 degrees with respect to the first clock. The first and second clocks 512a,b are provided to respective first and second phase shifter modules 510a,b. The first phase shifter module 510a generates six phase-shifted clock signals 514a-f. In an example embodiment, each of the clock signals 514a-f are separated in phase by 15 degrees and provided to a first counter/adder module 550a. Each of the first column counter/adder modules 550a-d accept the phase shift clocks from the phase shifters 510a,b.

As shown in the figure, each of the phase shifted clocks are decomposed into in-phase and quadrature components, using an instance of balanced delay inverting splitter 552 for each of the phase shifted clocks 514a-f from each of the phase shifters 510a,b. The delay time from each of these split paths need to be balanced in order to ensure same propagation time from the source phase shifters 510a,b to counter/adder 550a-d. The set of quadrature components output from inverting splitters 552 are then input to a second counter/adder 550b or those phase shift signals from phase shifter 510a, and input to counter/adder 550d for those from phase shifter 510b. In embodiments, the inverting splitter 552 inverts an input signal so the inverted output and non-inverted output are 180 degrees out of phase with each other. The paired counter/adders 550a,b and 550c,d are each clocked by the base phase clock 514a from their respective phase shifter 510a,b. Consequently, each of the values of these clocks is added to the current summed time at each transition of clock 514a.

The second phase shifter 510b similarly provides non-inverted phase shifted clock signals to a third adder/counter 550c and inverted phase-shifted clock signals to a fourth adder/counter 550d. The outputs of the adder/counters 550a-d are added by first and second adder modules 552a,b, in a manner similar to that described above.

Figure 6:
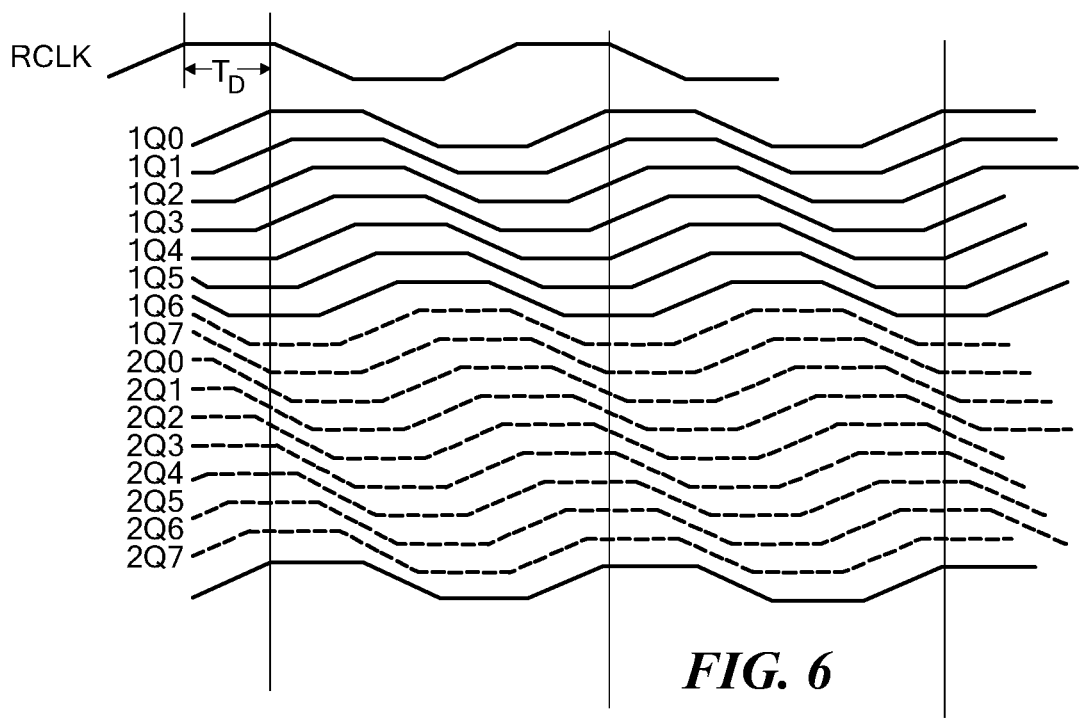
FIG. 6 is a waveform diagram showing example 16 clocks separated in phase by 22.5 degrees.

FIG. 6 shows example phase-shifted clocks in a first group 1Q0-7 and a second group 2Q0-7. Each of the clocks are separated by 22.5 degrees (360/16). In embodiments, the first group of clocks 1Q0-7 can be generated by a first phase shifter module and the second group of clocks 2Q0-7 can be generated by a second phase shifter module. The phase shifter modules can be similar to the phase shifter module 202 in FIG. 2 with a PLL that shifts the output 22.5 degrees with respect to the reference clock. A propagation time $T_D$ from the reference clock input to output from the phase shifter module is shown.

Figure 6A:
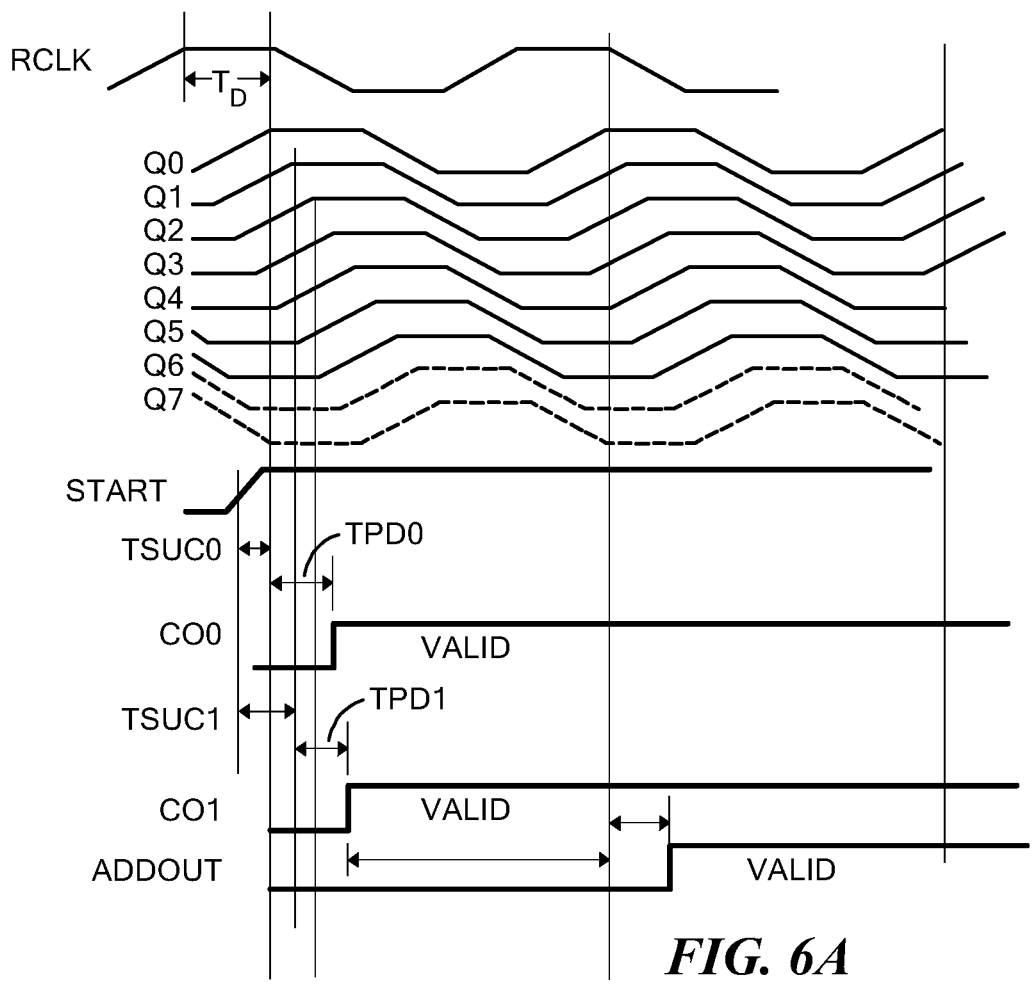
FIG. 6A is a timing diagram showing phase-shifted clocks incrementing respective counters.

FIG. 6A shows a reference clock RCLK used to generate eight phase-shifted clocks Q0-7. After receipt of a START signal, and setup time TSUC0 and propagation time TPD0 for a first counter, the output CO0 of the first counter is valid. Similarly, the value for a second counter CO1, which is incremented by clock Q1, is valid after setup time TSUC1 and propagation TPD1 for the second counter. After the clocks Q0-7 cycle through, the sum ADDOUT of values in the counters C0-7 is valid after setup and delay times. It is understood that only first and second counter outputs are shown for convenience. Summing counter values with adders is described above in detail.

In another aspect, a system having phase-shifted clock signals can measure one or more events with enhanced accuracy and/or precision as compared with conventional systems. In some embodiments, a system measures I/O trace connections to system processing devices. The system can examine the integrity and characteristics of signals to and from an external device connected to a test system, for example.

Figure 7:
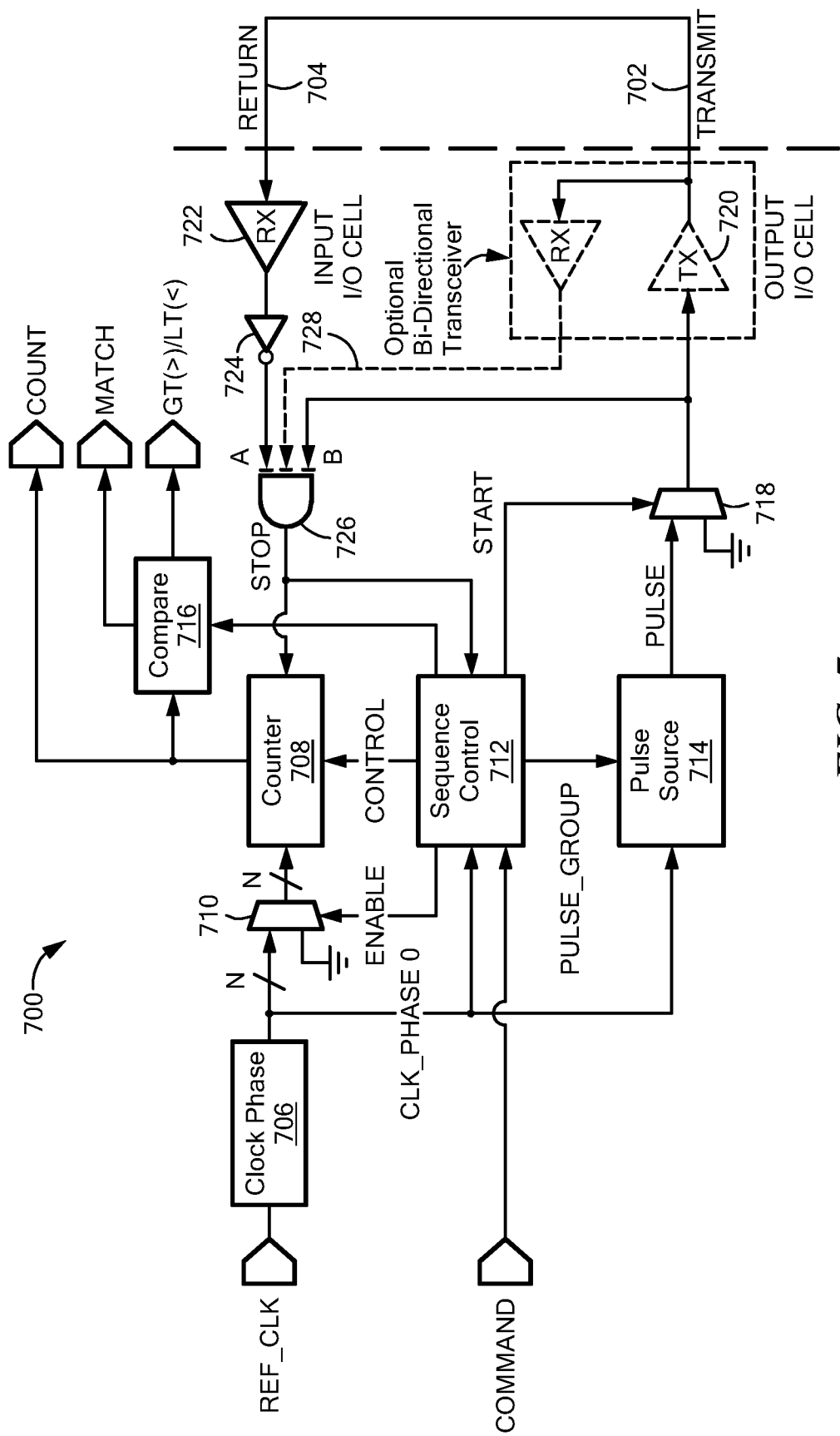
FIG. 7 is a schematic representation of an example timing and measurement system in accordance with example embodiments of the invention.

FIG. 7 shows an example pulse measurement sensor system 700 for measuring a time at which an event occurs. In the illustrated embodiment, the time is measured for a transmit pulse 702 to exit an IO and return as a receive pulse 704.

In the illustrated embodiment, a reference clock REF_CLK is received by a phase shifter module 706, which may be provided by the phase shifter 202 of FIG. 2. The phase-shifted clocks can be input to a counter module 708, which may be provided as the counters 206 shown in FIG. 2. A mux 710 may be coupled to an input of the counter module 708 to reset and hold the counter values to the zero value and then by selecting the phase shifted clock inputs, enable counting under the control of a sequence control module 712, which may receive command signals for pulse measurements. A pulse source 714 is coupled to the sequence control module 712 and is configured to receive one or more phase-shifted clocks from the phase shifter module 706. A compare module 716 is controlled by the sequence control module 712 and configured to receive the count value from the counter module 708. In the illustrated embodiment, example outputs include the count value COUNT, a match indicator MATCH and GT/LT signal indicator signal indicative of whether the count value from the counter module 708 is less than or greater than the value in the compare module 716.

In an example embodiment, a pulse from the pulse source 714 goes through a mux 718 to a transmit buffer 720 which outputs the transmit signal 702 at an IO for example. The mux 718 serves to enable pulses to be transmitted or otherwise transmission is disabled.

Figure 8:
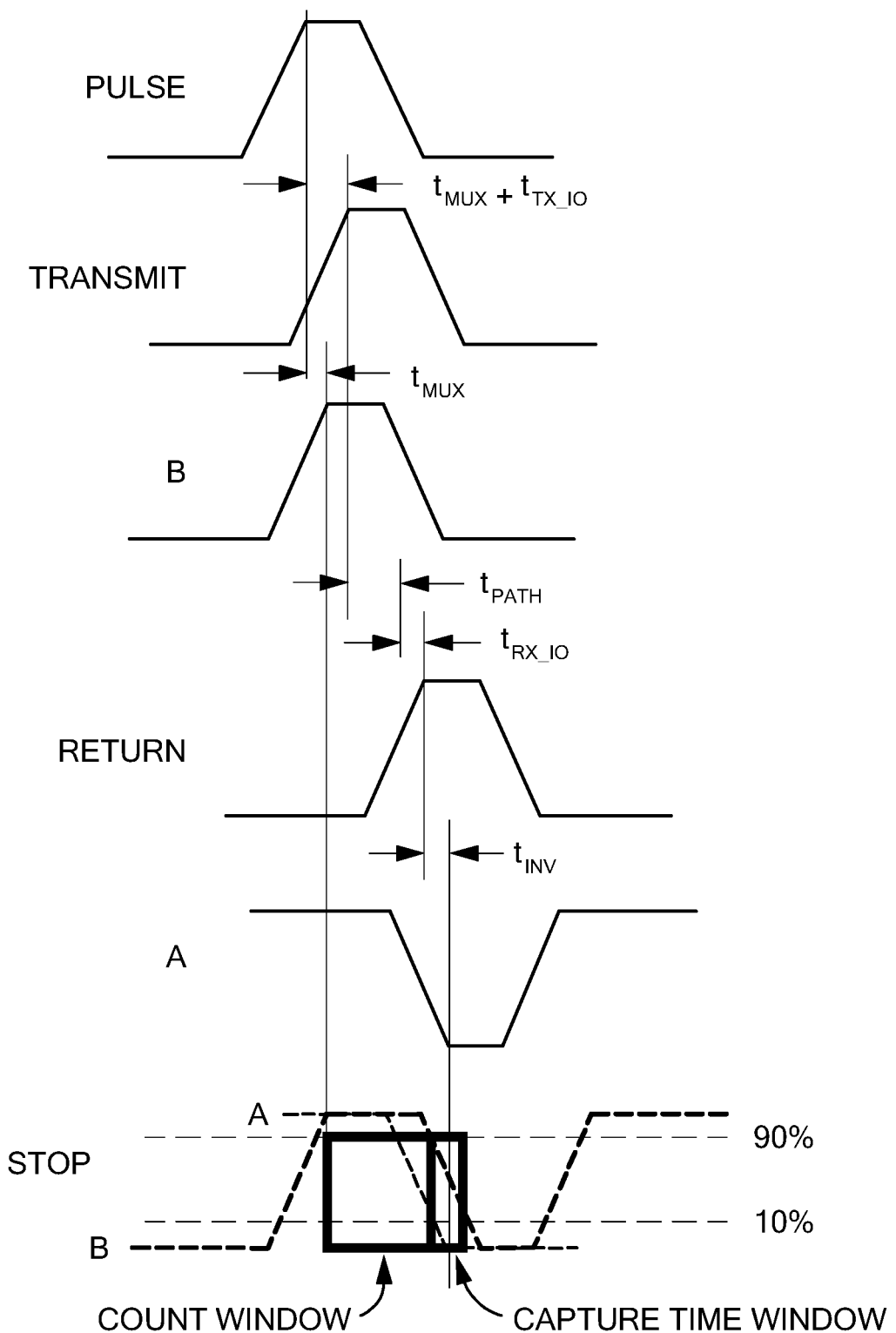
FIG. 8 is a timing diagram showing pulse propagation and data capture for the system of FIG. 7.

The system receives the return pulse 704 at a different IO at a receive buffer 722. In the illustrated embodiment, the received pulse is inverted by an inverter 724 and input to a signal comparison circuit 726, which is an AND gate 726 in the example embodiment. An optional signal path 728 for a transceiver to the AND gate 726 can be included. The resulting pulse signal timing at the output of this AND gate 726 serves to enable the counter 708 to begin counting at the rising edge of the resulting pulse and then to disable the count on the falling edge as is illustrated in FIG. 8 below.

By analyzing the counter value COUNT and compare information MATCH and the like associated with transmitting and receiving pulses, the system can identify circuit card assembly issues, such as interconnection faults, bad circuit traces, solder bump defects, manufacturing defects, etc. by comparison to designed parameters. If there are gross defects or anomalies, then those are detected by a single measurement compared to baseline/acceptable thresholds set to the limits of environmental and operational minima or maxima. Indeed, there may not be a pulse return at all if the transmission path is severely compromised.

For those issues are more subtle or where the subject interconnection is operated at high performance, a single measurement may not be sufficiently accurate. Because measurements in real systems are expected to be made in situ when the subject system is operating, the pulse signaling occurs in the presence of thermally produced noise and electromagnetic interference from other sources. Consequently, analysis may require a series of such measurements followed by statistical analysis performed to compensate from additive thermal noise and electromagnetic interference. This analysis must converge to a single, stable result by collection of enough data points to permit filtering of all statistically non-stationary interference terms. Indeed, due to the law of large numbers, the series must converge to a single value, although only enough data need be collected to satisfy desired statistical confidence bounds.

In other applications, the pulse time may identify security issues when pulse measurement time estimates change more than the established minima or maxima threshold amounts. When the system is initially manufactured, measurements of the as-manufactured transmission paths would be collected and stored to be used by a security application to use for later reevaluation. If at some later time, these measurements are retaken, such as by a system security function, and the results no longer correspond to the as-manufactured values, this indicates that the system has a) suffered some fault condition associated with the measurement or circuitry along the signaling path or the path has physically changed. Either conditions could occur due to damage or mishandling, however they could also indicate deliberate modifications as well. Changes could be characterized and correlated to system modifications indicative of a tamper attack. For example, assume two assemblies are connected with paths measured that span the interface. If the path distances increase, that would be indicative that some circuit or interposer was added between the two in order to monitor behavior or insert signals. If the paths decrease, a seemingly impossible outcome, then some more radical alteration has occurred. Either case could be used to trigger an alarm that a security problem has been encountered.

It is understood that other circuit implementations are possible without departing from the scope of the claimed invention. For example, an inverter can be used for the B input to the AND gate instead of the A input. A wide range of different circuit elements, gates, components, logic circuits, comparison circuits, and the like can be used to meet the needs of a particular application. It is further understood that a wide range of events can be timed for various application. In addition, the number of counter bits can be selected for particular time ranges, however, any practical number of bits can be used.

FIG. 8 shows an example timing diagram for the signals shown in FIG. 7 for pulse measurement timing. The PULSE signal is output from the pulse source 714 and exits an IO as the TRANSMIT signal. The rising edge of the pulse of the TRANSMIT signal is delayed by propagation time $t_{MUX}$ through the mux 718 and the propagation time $t_{TX\_IO}$ through the transmit buffer 720. The output of the mux is an input signal B to the AND gate 726 with a propagation delay time of $t_{MUX}$.

The RETURN signal 704, which is a delayed version of the TRANSMIT pulse 702, has a rising edge after a delay $t_{PATH}$ for a path from transmit IO to receive IO, where delay $t_{PATH}$ extends from the end of time $t_{MUX}+t_{TX\_IO}$, and a delay $t_{RX\_IO}$ through the receive IO. The RETURN signal output from the receive IO has a delay $t_{INV}$ through the inverter 724. The output of the inverter 722 is a signal A to the AND gate 726.

When signals A and B are both HI, the output of the AND gate 726 is a rising edge which generates a STOP signal so the counter module 708 stops incrementing the counter value(s). As can be seen, signal A has a default state, e.g., no pulse, which is HI due to the inverter 724, and signal B transitions as soon as the PULSE signal goes though the mux 718 and arrives at the AND gate 726 as signal B, which transitions the STOP signal to the counter module 708. As shown in the STOP signal waveform, there is a count window while signals A and B are HI and a capture time window as the A and B signals fall from HI to LO. In embodiments, the capture time window should capture the value in the counter module 716 at the time the STOP signal is activated.

When the STOP signal occurs, the value in the compare module 716 can be compared to the value in the counter module 716. The compare module 716 control the MATCH signal to indicate the result of the compare. The COUNT signal outputs the counter value in the counter module 716. The GT/LT signal can indicate whether the value in the counter is less than or greater than the value in the compare module.

Figure 9:
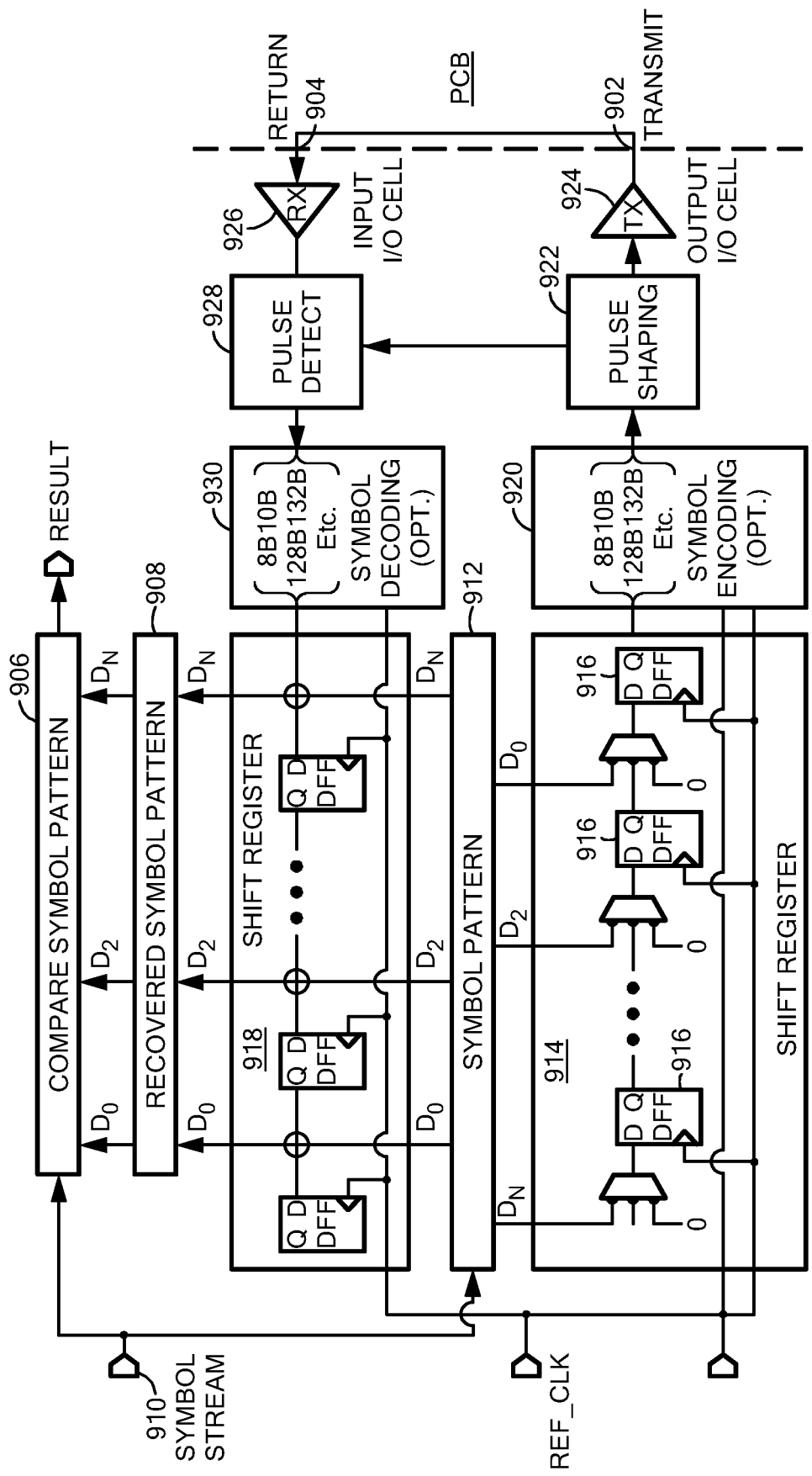
FIG. 9 is a schematic representation of an example test system in accordance with example embodiments of the invention.

FIG. 9 shows an example pulse measurements system 900 for analyzing a circuit assembly, such as a printed circuit board (PCB) coupled to a transmit IO 902 and a receive IO 904 of the system. This case is a generalization of the prior pulse measurement circuit where instead of transmitting and receiving single pulses, binary or encoded pulse groups are transmitted and received. The benefit is that pulse detection is more reliably accomplished when signaling occurs at very high speeds or at very low to negative signal to noise ratios, as is well known.

A compare symbol pattern module 906 can receive, store and compare values against values from a recovered symbol pattern 908. A symbol stream 910 can input a bit stream into the compare symbol pattern module 906 and to a symbol pattern module 912, which is coupled to a first shift register 914 having a series of bits D0-N. In example embodiments, the first shift register 914 comprises a series of flip flops 916, which can be coupled to a reference clock RCLK. A second shift register 918 is also coupled to the reference clock RCLK. A first encoder 920 encodes the values from the first shift register 914 for pulse shaping 922. Pulses are output by a transmit element 924 connected to the transmit IO 902. The transmitted pulses are received on the receive IO 904 after some delay by a receive element 926 and output of which is connected to a pulse detection circuit 928. A decoder module 930 decodes the detected pulses and the second shift register 918 receives the decoded pulses that are provided to the recovered symbol pattern module 908 for comparison against the original symbol stream stored in the compare symbol pattern module 906.

Statistical analysis comparing detected receive bit patterns with the expected (transmitted) values attempts to identify a time for return assuming that bit errors are occurring with the returned pattern. Moreover, if the Pulse Detection Circuit 928 incorporates an Analog-to-Digital Converter (ADC), then each of the sequential registers captures a set of bits corresponding the output bit width (resolution) of the ADC.

Single instances of recovered signal patterns 908 are input to a Compare Symbol Pattern circuit 906 which in some embodiments can be a matched filter. The output of the Compare Symbol Pattern circuit 906 is the filtered output which itself in some embodiments would be a pulse corresponding to the shape of the time of arrival group estimate. As with the measurement circuits above, the high resolution counter from FIG. 2 is enabled at the time corresponding to the start of the pulse group and is terminated at the falling edge or final value from the output from Compare Symbol Pattern circuit 906. Constant differences due to difference from initial pulse to pulse group detection due to number of bits, etc. in the idealized case are subtracted to provide the measure of the actual path turn-around time.

Figure 10:
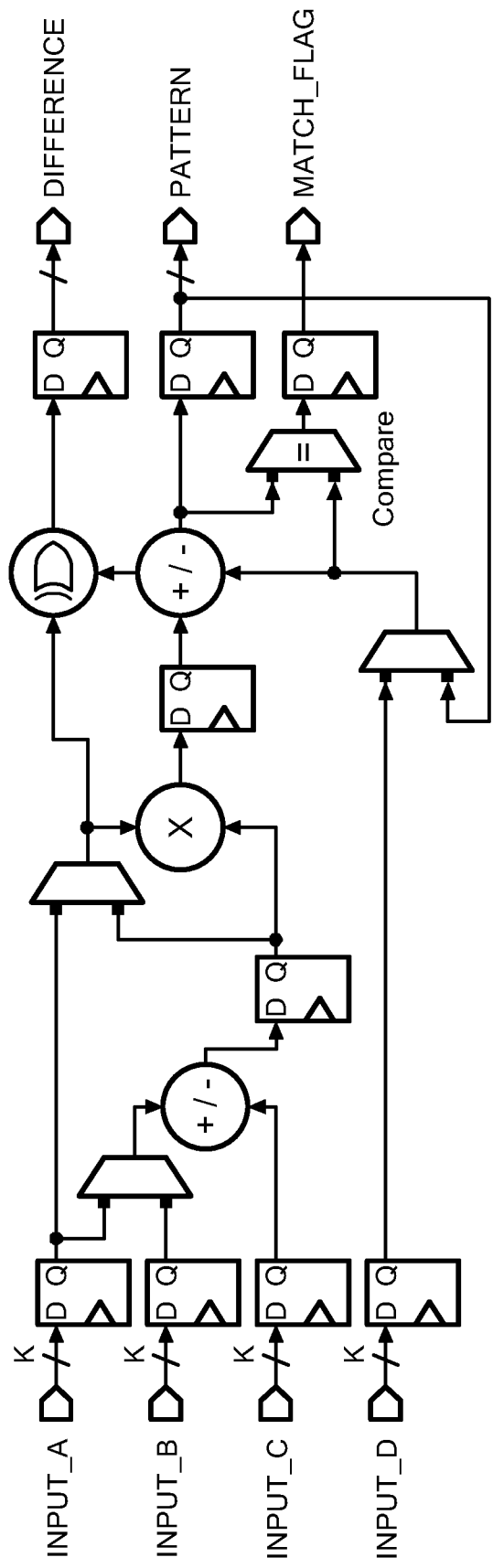
FIG. 10 is a block diagram of an example FPGA processing block that can be used for implementing embodiments of the invention.

FIG. 10 shows a representative processing block from a FPGA component that can be programmed to implement circuitry described above. These hard macro blocks are commonly referred to as DSP blocks since the incorporate a hardware implemented multiply-accumulate (MAC) commonly used for digital signal processing. Modern FPGAs typically incorporate a number of these blocks. Because they are implemented in hardware, they provide much higher performance for implementing this capability versus implementation in the programmable logic fabric for the FPGA. The use of these blocks is a feature of FPGAs for implementation the phase shifter, counters, adders, and circuitry described above when programming the device is to implement these functions. This is because of the much higher performance combined with access to routing resources typically optimized for arrays of these circuits to perform signal processing.

Embodiments of the invention can provide signal measurements for measuring I/O trace connections to system devices. For Field Programmable Gate Array (FPGA) devices the problem of verification of the correctness or integrity of signal traces for any of the Input/Output (I/O) signals to or from the device is solved by application of reconfigurable signal measurement sensor technology systematically inserting and connecting measurement circuitry to each I/O of the device, measuring the properties of the physical signal trace of wire connected to that I/O in situ, and then removing or replacing that function with the normal application circuitry used in the device.

Expected baseline behavior can be determined during design and simulation with precise results measured during an initial characterization of the assembly or subsystem, measured again as warranted during boot, or monitored in a recurring manner if necessary. This can be accomplished during test, at system start-up, as might be commanded during a Built-in-Test (BIT) operation, when necessary to troubleshoot a system.

In some embodiments, separate transmit and return (receive) I/O are used. In other embodiments bi-directional I/O are used. In some embodiments, bi-directional I/O is used at the transmit I/O and an optional secondary return I/O is used. Choices of the type and configuration can be based on the physical configurations of the signals to be tested. In some embodiments, the pulses are digitally modulated whereas in others the test signals are analog pulses. In some embodiments, single pulses are used as the test signal. In other embodiments pulse data, trains or groups may be used. Pulse data may be encoded using a digital coding scheme.

Signal transition edges may deteriorate with frequency-dependent attenuation of high frequency signal components. Data edges contain the signal's high-frequency energy components. Pre-emphasis is a technique that may be used to boost a transmitted signal's high-frequency components while leaving low-frequency components in their original state, boosting high frequency energy every time a transition occurs.

Figure 11:
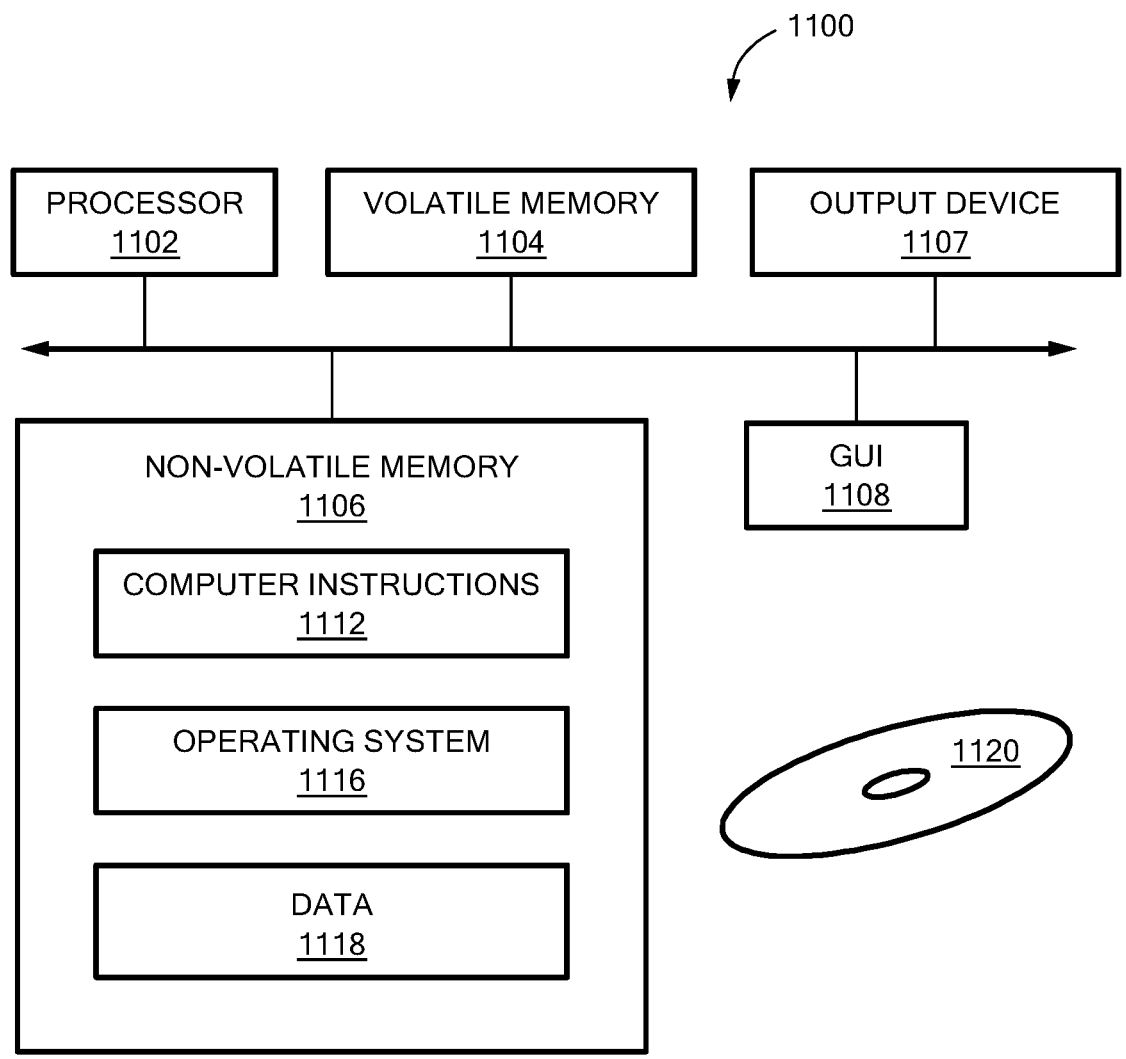
FIG. 11 is a schematic representation of an example computer that can perform at least a portion of the processing described herein.

FIG. 11 shows an exemplary computer 1100 that can perform at least part of the processing described herein, such as the processing of FIGS. 1, 3, 7, 13 and equations contained here. For example, the computer 1100 can perform processing to generate signals for array antenna elements to shape a beam and spoil the beam in u and/or v space, as described herein. The computer 1100 includes a processor 1102, a volatile memory 1104, a non-volatile memory 1106 (e.g., hard disk), an output device 1107 and a graphical user interface (GUI) 1108 (e.g., a mouse, a keyboard, a display, for example). The non-volatile memory 1106 stores computer instructions 1112, an operating system 1116 and data 1118. In one example, the computer instructions 1112 are executed by the processor 1102 out of volatile memory 1104. In one embodiment, an article 1120 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high-level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A method, comprising:
    generating phase-shifted clock signals from a reference clock, wherein one cycle of the reference clock is 360 degrees, and wherein respective phase shifts for the phase-shifted clock signals are within the one cycle of the reference clock, wherein N is the number of the phase-shifted clocks, and a phase difference between each of the phase-shifted clocks is 360/N;
    connecting the phase-shifted clock signals to a counter module so that the phase-shifted clock signals change values in counters in the counter module; and
    combining the values in the counters to generate an output signal corresponding to an amount of time.

2. The method according to claim 1, wherein the phase-shifted clocks have a selected phase shift.

3. The method according to claim 1, wherein the phase-shifted clock signals cover 360 degrees with respect to the reference clock.

4. The method according to claim 1, wherein each of the phase-shifted clock signals increments a respective one of the counters in the counter module.

5. The method according to claim 4, wherein values from pairs of the counters are summed together.

6. The method according to claim 5, wherein the output signal corresponds to a sum of values from each of the counter.

7. A method, comprising:
    generating phase-shifted clock signals from a reference clock, wherein one cycle of the reference clock is 360 degrees, and wherein respective phase shifts for the phase-shifted clock signals are within the one cycle of the reference clock;
    connecting the phase-shifted clock signals to a counter module so that the phase-shifted clock signals change values in counters in the counter module; and
    combining the values in the counters to generate an output signal corresponding to an amount of time,
    wherein a phase locked loop is used to generate the phase-shifted clock signals.

8. The method according to claim 1, further including inverting splitters coupled to the phase-shifted clock signals to generate an inverted signal and a non-inverted signal that are connected to different ones of the counters.

9. The method according to claim 1, further including programming a Field Programmable Gate Array (FPGA) to perform the steps of:
    generating phase-shifted clock signals from a reference clock;
    connecting the phase-shifted clock signals to a counter module so that the phase-shifted clock signals change values in counters in the counter module; and
    combining the values in the counters to generate an output signal corresponding to an amount of time.

10. The method according to claim 9, further including programming macros for the FPGA in parallel.

11. The method according to claim 1, wherein the output value describes millisecond times and the counters provide greater than gigabit resolution.

12. The method according to claim 1, further including transmitting a pulse to an externally connected device and receiving the transmitted pulse.

13. The method according to claim 12, further including measuring a time from transmitting the pulse to receiving the transmitted pulse, wherein the measured time corresponds to the combined values in the counters.

14. The method according to claim 13, wherein the measured time corresponds to a distance including signal traces.

15. The method according to claim 13, further including identifying faults based on the measured time.

16. The method according to claim 13, further including identifying an unexpected component in the connected device based on the measured time.

17. The method according to claim 13, wherein the transmitted pulse is generated from one or more of the phase-shifted clocks.

18. The method according to claim 13, further including comparing the measured time to a value and generating a signal indicative of the comparison.

19. The method according to claim 13, further including comparing the measured time for a bootup sequence and generating a signal indicative of the comparison.

20. The method according to claim 13, further including transmitting encoded pulses to an externally connected device, receiving the encoded pulses, decoding the encoded pulses, and comparing the decoded pulses with a stored version of the transmitted encoded pulses.

21. The method according to claim 1, wherein each of the phase-shifted clocks contains only one rising edge during the one cycle of the reference clock.

* * * * *